(12) United States Patent
You

(10) Patent No.: US 6,950,346 B2
(45) Date of Patent: Sep. 27, 2005

(54) FLASH MEMORY FOR REDUCING PEAK CURRENT

(75) Inventor: Chang-Ho You, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/633,848

(22) Filed: Aug. 4, 2003

(65) Prior Publication Data

US 2004/0042324 A1 Mar. 4, 2004

(30) Foreign Application Priority Data

Sep. 4, 2002 (KR) .............................. 10-2002-0053120

(51) Int. Cl.[7] .............................................. G11C 16/04
(52) U.S. Cl. ............................ 365/185.25; 365/185.28; 365/185.33
(58) Field of Search ....................... 365/185.25, 185.28, 365/185.33, 203

(56) References Cited

U.S. PATENT DOCUMENTS

| | | | |
|---|---|---|---|
| 4,858,194 A | 8/1989 | Terada et al. ............... | 365/203 |
| 5,343,433 A | 8/1994 | Duvvury et al. ............. | 365/205 |
| 6,005,802 A | 12/1999 | Takeuchi et al. ......... | 365/185.02 |
| 6,028,788 A | * 2/2000 | Choi et al. .............. | 365/185.11 |
| 6,195,297 B1 | * 2/2001 | Sano ..................... | 365/189.11 |
| 6,480,419 B2 | * 11/2002 | Lee ....................... | 365/185.18 |
| 6,650,566 B2 | * 11/2003 | Jeong et al. ........... | 365/185.12 |

FOREIGN PATENT DOCUMENTS

EP          1 235 230 A2      8/2002

* cited by examiner

*Primary Examiner*—Son Mai
(74) *Attorney, Agent, or Firm*—F. Chau & Associates, LLC

(57) ABSTRACT

In a flash memory, non-selected bit lines prohibited from being programmed are first charged to a predetermined level and then a pumping voltage is generated, the precharging operation to all the bit lines is completed so that a peak current due to a voltage charging concentration is suppressed or decentralized, the memory cell array is divided into two or more portions, and the bit lines are precharged; the flash memory includes a memory cell array having pages that each include memory cells and bit lines and source lines, a first circuit for charging non-selected bit lines among the bit lines to a first voltage level at a first time, a second circuit for generating a pumping voltage higher than a power supply voltage at a second time, and a third circuit for charging the bit lines to a second voltage level at a third time.

30 Claims, 6 Drawing Sheets

FLASH MEMORY FOR REDUCING PEAK CURRENT

BACKGROUND OF THE INVENTION

1. Field of the Invention

The present invention relates to a flash memory, and more particularly, to a flash memory in which bit lines are precharged in a program operation.

2. Description of the Related Art

In a flash memory, a plurality of memory cells are connected to one word line and divided into pages by units of one or more word lines. The memory cells connected to one word line are connected to corresponding bit lines. A row decoder and a column decoder select word lines and bit lines, respectively. The flash memory performs an erase operation, a program (write) operation and a read operation. The memory cells arranged in the flash memory are a stacked gate type or a split gate type. Whether the stacked gate type or the split gate type, the flash memory performs the program operation or the erase operation using electrons at a floating gate. The erase operation is performed to sectors (or blocks) including a plurality of pages, or each memory cell at once.

The program operation is performed at each memory cell, or alternately at each page. For example, as shown in FIG. 1, Vt+0.4 V (where Vt is a threshold voltage of a memory cell) is applied to a control gate CG of the memory cell through the word line WL selected according to address information, 10 V is applied to a source S through a source line SL, and 0.4 V is applied to a drain D through a selected bit line BL. Then, electrons drawn to the source along an electric field generated between the drain D and the source S are tunneled to the floating gate due to the hot electron effect. As a result, the threshold voltage of the memory cell is increased. Each memory cell with an increased threshold voltage due to the program operation is determined as an off-cell in the read operation.

In this program operation, since one word line is connected to a plurality of memory cells and each memory cell is connected to a bit line, the memory cells connected to non-selected bit lines among the memory cells connected to the selected word line should be prohibited from being programmed when selectively programming one memory cell (program prohibition operation). As one of the general methods, the selected bit line (or the bit line connected to the selected memory cell) and the non-selected bit lines (or the bit lines connected to the non-selected memory cells among the memory cells connected to the selected word line) are precharged to the power supply voltage VDD and the program operation is performed to the selected memory cell.

Referring to FIG. 2 showing the conventional program operation, if a high voltage signal HVEN is activated at the time t1, a charge pump of the memory device begins to increase a high voltage VPP to the voltage level (for example, 10 V) required for the program operation. The bit lines BLS and BLN are simultaneously precharged to the power supply voltage VDD in response to the activations of signals PBLS and PBLN, which respectively precharge the selected bit line BLS and the non-selected bit lines BLN at a time t2 when a program signal PGM is activated to be at high level. In this procedure, a peak current is generated since the selected bit line BLS and the non-selected bit line BLN are precharged at once in the interval between the time t2 and time t3. In general, 1024 bit lines including one selected bit line are precharged to the power supply voltage at once and the peak current increases greatly since one memory cell block consists of at least 1024 bit lines. Further, when the bit lines are not fully charged up to the high voltage VPP even at the time t2, the peak current is further increased since they are charged up to the high voltage VPP while the bit lines are precharged in an interval between t2 and t3.

Such a peak current is a large obstacle in interfacing terminals when a flash memory is used in a smart card for communications or personal information storage. For example, the peak current can greatly affect operational stability or reliability in a subscriber identify module card (SIM) as used in a mobile communications terminal.

SUMMARY OF THE INVENTION

Accordingly, the present invention is directed to a flash memory that substantially obviates one or more problems due to limitations and disadvantages of the related art.

It is a feature of the present invention to provide a device for suppressing the peak current generated for a program operation of a flash memory.

It is another feature of the present invention to provide a device for suppressing the peak current generated in a program operation of a flash memory used in a smart card.

Additional advantages, objects, and features of the invention will be set forth in the description which follows or will become apparent to those having ordinary skill in the pertinent art upon examination of the following, or may be learned from practice of the invention. The objectives and other advantages of the invention may be realized and attained by the structure particularly pointed out in the written description and claims hereof as well as the appended drawings.

In an aspect of the present invention, there is provided a flash memory, which comprises: a memory cell array having pages that each include memory cells, bit lines and source lines; a first circuit for charging non-selected bit lines among the bit lines to a first voltage level at a first time; a second circuit for generating a pumping voltage higher than a power supply voltage at a second time; and a third circuit for charging the bit lines to a second voltage level at a third time.

The first voltage level is lower than the second voltage level. The second voltage level is the power supply voltage. The second time when a pumping voltage is generated is longer than the first time by a predetermined interval during an activated state of a predetermined pulse signal. The third time depends on the activation of the program signal after the second time.

The first circuit is responsive to a high voltage signal and the address information associated with the non-selected bit lines, in which the high voltage signal is activated to generate the pumping voltage. The first circuit is inactivated while an erase control signal is in an activated state. The third circuit charges the bit lines to the third voltage level in response to a program start signal at the third time.

In another aspect of the present invention, there is provided a flash memory which comprises: memory cell arrays having pages each of which includes memory cells, bit lines and source lines, and the memory cell arrays are selectively driven according to address information; a first circuit for charging non-selected bit lines among the bit lines to a first voltage level at a first time; a second circuit for generating a pumping voltage higher than a power supply voltage at a second time; and a third circuit for charging the bit lines to a second voltage level at a third time, in which the bit lines are contained in a selected memory cell array among the memory cell arrays.

The third circuit charges the bit lines to the third voltage in response to a program start signal at the third time, and the bit lines are contained in the memory cell array selected according to the address information.

In another aspect of the present invention, there is provided a flash memory, which comprises: a first memory cell array being selected when a predetermined address bit is in a first logic state; first precharge transistors for connecting bit lines of the first memory cell array to a power supply in response to a first precharge signal; a second memory cell array being selected when the address bit is in a second logic state; second precharge transistors for connecting bit lines among the second memory cell array to the power supply in response to a second precharge signal; a first circuit for charging non-selected bit lines among the bit lines to a first voltage level at a first time; a second circuit for generating a pumping voltage higher than a voltage of the power supply at a second time; and a third circuit for charging the bit lines up to a second voltage level at a third time, in which the bit lines are contained in a memory cell array selected according to the logic states of the address bit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings. However, the present invention is not limited to the embodiments illustrated herein, but such embodiments are introduced to promote understanding of the scope and spirit of the present invention.

Figure 1:
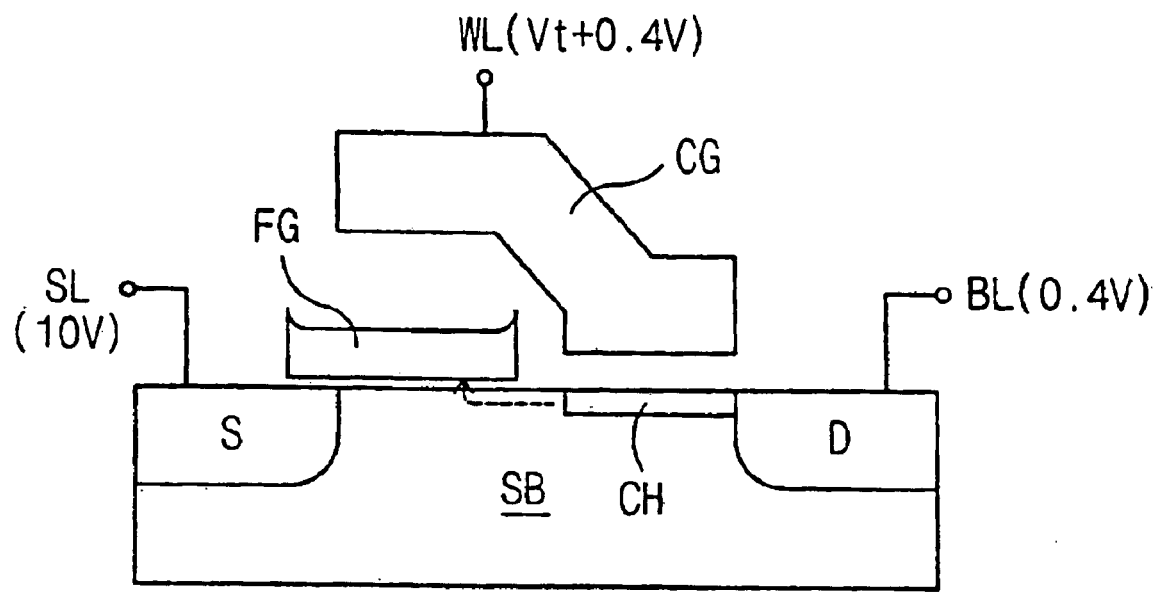
FIG. 1 is a schematic example of a memory cell used in a conventional flash memory.
Figure 3:
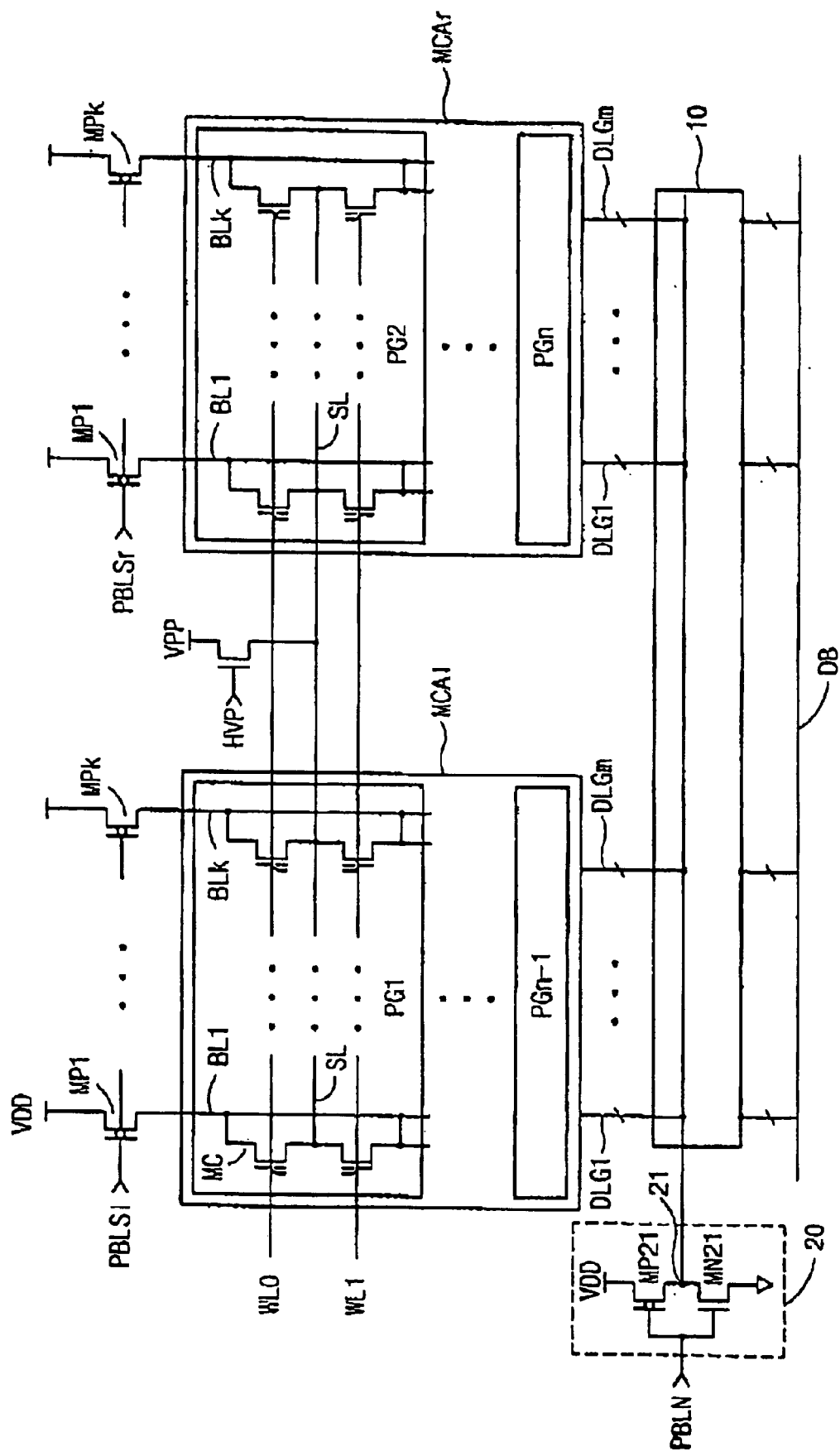
FIG. 3 is a schematic view of a flash memory according to an embodiment of the present invention.

FIG. 3 is a schematic view of a flash memory according to an exemplary embodiment of the present invention. The exemplary flash memory is divided into two memory cell arrays, MCAl and MCAr, according to address information so as to suppress or decentralize the peak current. Each of the memory cell arrays includes a plurality of pages. A left memory cell array MCAl includes odd numbered pages PG1, PG3, . . . , and PGn−1 and a right memory cell array MCAr includes even numbered pages PG2, PG4, . . . , PGn. A page, such as PG1, for example, includes memory cells MC arranged in a row and connected to bit lines BL1 to BLk. A bit line, such as BL1, for example, of this page is connected to the drains of two memory cells arranged in a column, and sources of the memory cells are commonly connected to the source line SL. Control gates CG of the memory cells MC that are arranged in a row in one page are commonly connected to one word line (for example, WL0 or WL1). It shall be understood by those of ordinary skill in the pertinent art that although a split type of flash memory cell is shown in FIG. 1 and used in FIG. 3 for exemplary purposes, a stacked type of flash memory cell can be arranged in alternate embodiments.

The flash memory is divided into the memory cell arrays MCAl and MCAr to precharge the bit lines separately. In other words, precharge signals, which are applied to the gates of precharging PMOS transistors MP1 to MPk for connecting the power supply voltage VDD to the bit lines BL1 through BLk, are grouped into PBLS1 precharge signals for the left memory cell array MCAl and PBLSr precharge signals for the right memory cell array MCAr.

Figure 5:
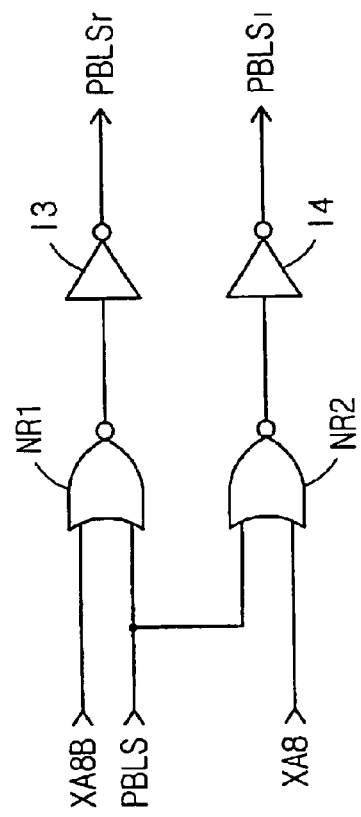
FIG. 5 is a schematic illustration of a circuit for generating signals used to precharge bit lines according to an embodiment of the present invention.

As shown in FIG. 5, a logic circuit, which includes NOR-gates NR1 and NR2, groups the precharge signals for the grouped memory cell arrays by NORing the original bit line charge signal PBLS (hereinafter referred to as a main precharge signal) and a predetermined address bit, such as, for example, the eighth bit XA8/XA8B. In a state where the main precharge signal PBLS is activated to a low level, if the corresponding address bit XA8 is at a low level (where XA8B is at a high level, the bit line is generally precharged when the page or the memory cell array to which the bit line belongs is not selected for the program operation), the bit line precharge signal PBLS1 (hereinafter referred to as a first precharge signal) for the left memory cell array MCAl is activated to a low level, so that the bit lines BL1 through BLk of the left memory cell array MCAl are charged up to the power supply voltage VDD. In addition, in a state where the bit line precharge signal PBLS is activated to a low level, if the address bit XA8 is at a high level (where XA8B is at low level), the bit line precharge signal PBLSr (hereinafter referred to as a second precharge signal) for the right memory cell array MCAr is activated to a low level, so that the bit lines BL1 through BLk of the right memory cell array MCAr are charged up to the power supply voltage VDD.

In the operational division of the memory cell arrays based on bit line precharge, the flash memory of FIG. 3 can be divided into more than two memory arrays without increasing the inconvenience of address bit coding.

The bit lines arranged in the memory cell arrays are connected to data lines DLG1 through DLGm in bundles of several (for example, sixteen) bit lines. One data line is connected to several bit lines in a usual column-gating manner. Accordingly, for example, one data line corresponds to sixteen bit lines. The block 10 positioned between data lines DL1 through DLm and a database DB includes column gate circuits and write buffers (or page buffers). The column gate circuits include column gates responsive to the column address signals that correspond to the bit lines. The write buffers temporarily store data to be programmed to a memory cell corresponding to data lines, and determine the states of the corresponding bit lines.

According to the present invention, the circuit 20 (hereinafter referred to as a "lead precharge circuit") is connected to the data lines DLG1 through DLGm. The lead precharge circuit 20 precharges non-selected bit lines first so as to decentralize a driving current during the bit line precharge. The circuit 20 includes a PMOS transistor MP21 and an NMOS transistor MN21 connected in series between the power supply voltage VDD and the ground voltage GND. Their gates are connected to the signal PBLN (hereinafter referred to as a "lead precharge signal") for precharging non-selected bit lines first. The node 21 between the PMOS transistor MP21 and the NMOS transistor MN21 is connected to data lines DLG1 through DLGm. Generation of the lead precharge signal PBLN will be described with reference to FIG. 6.

Unlike the related art, the selected bit line and the non-selected bit lines are not precharged at once before programming the selected bit line. It shall be noted that a charging timing of the high voltage VPP is different from a precharging timing of the selected bit line and non-selected bit lines. Such an operation will be described with reference to the timing diagram of FIG. 7.

Figure 2:
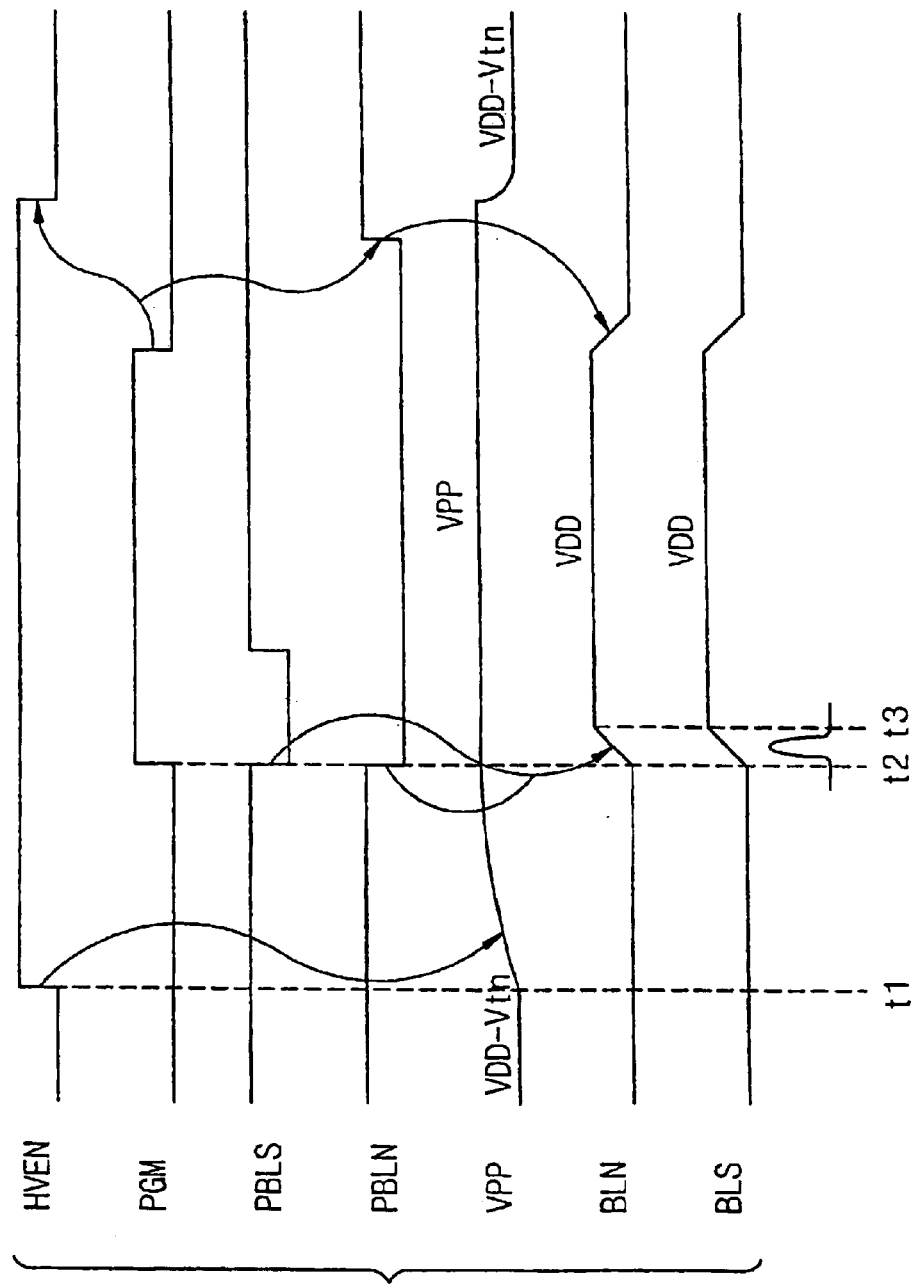
FIG. 2 is a timing diagram of a program operation in a conventional flash memory.
Figure 4:
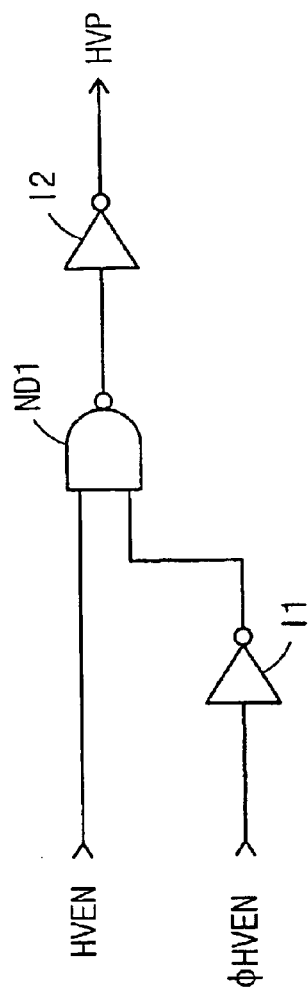
FIG. 4 is a schematic illustration of a circuit for generating a high voltage control signal according to an embodiment of the present invention.

Referring to FIG. 4, a control signal HVP (hereinafter referred to as a "high voltage control signal") for charging the high voltage (or, a pumping voltage) VPP is set using the logic combination of a high voltage signal HVEN (in the related art, a charging of the high voltage is started in response to the high voltage signal HVEN, such as shown in FIG. 2) and pulse signal ΦHVEN made from the high voltage signal HVEN. The high voltage signal HVEN is applied to an input of a NAND gate ND1 and the pulse signal ΦHVEN is applied to the other input of the NAND gate ND1 through an inverter I1. The NAND gate ND1 outputs a high voltage control signal HVP through the inverter I2. The pulse signal ΦHVEN is activated to a high level for a predetermined duration (for example, 600 ns) by a usual pulse generation circuit or the like. Accordingly, the high voltage control signal HVP is inactivated to a low level and not charged to the high voltage VPP while the pulse signal ΦHVEN is at a high level.

Figure 6:
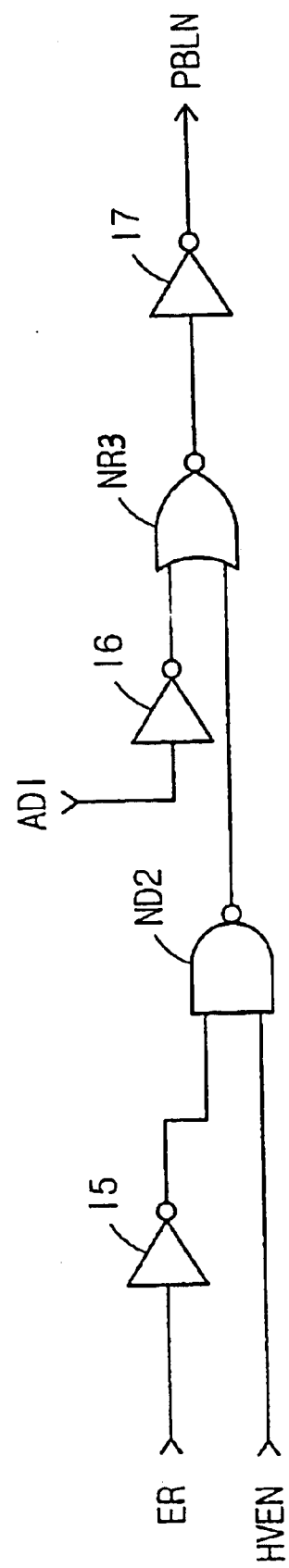
FIG. 6 is a schematic illustration of a circuit for generating a signal used to precharge non-selected bit lines according to an embodiment of the present invention.

FIG. 6 is illustrates a circuit for generating a lead precharge signal PBLN. The circuit charges non-selected bit lines first (before the bit line precharge signal PBLS is driven). An erase signal ER used to start the erase operation is applied to an input of the NAND gate ND2 through an inverter I5. The high voltage HVEN is applied to the other input of the NAND gate ND2. The output of the NAND gate ND2 is applied to a NOR gate NR3. An address information signal ADI is applied to the NOR gate NR3 through an inverter I6. The output of the NOR gate NR3 is outputted as a precharge signal PBLN through an inverter I7.

The state of the erase signal ER affects a generation path of the lead precharge signal PBLN because bit lines should not be charged, but be set to a ground voltage or about 0.4 V at the erase operation (a bit line and a source line are set to the ground voltage and the high voltage is applied to a word line at the erase operation). In other words, the lead precharge signal PBLN is fixed and inactivated to a high level while the erase signal ER is activated to a high level. Accordingly, since the address information signal ADI applied to NOR gate NR3 has the address information on the bit lines selected when programmed, the lead precharge signal PBLN is activated corresponding to the non-selected bit lines.

Figure 7:
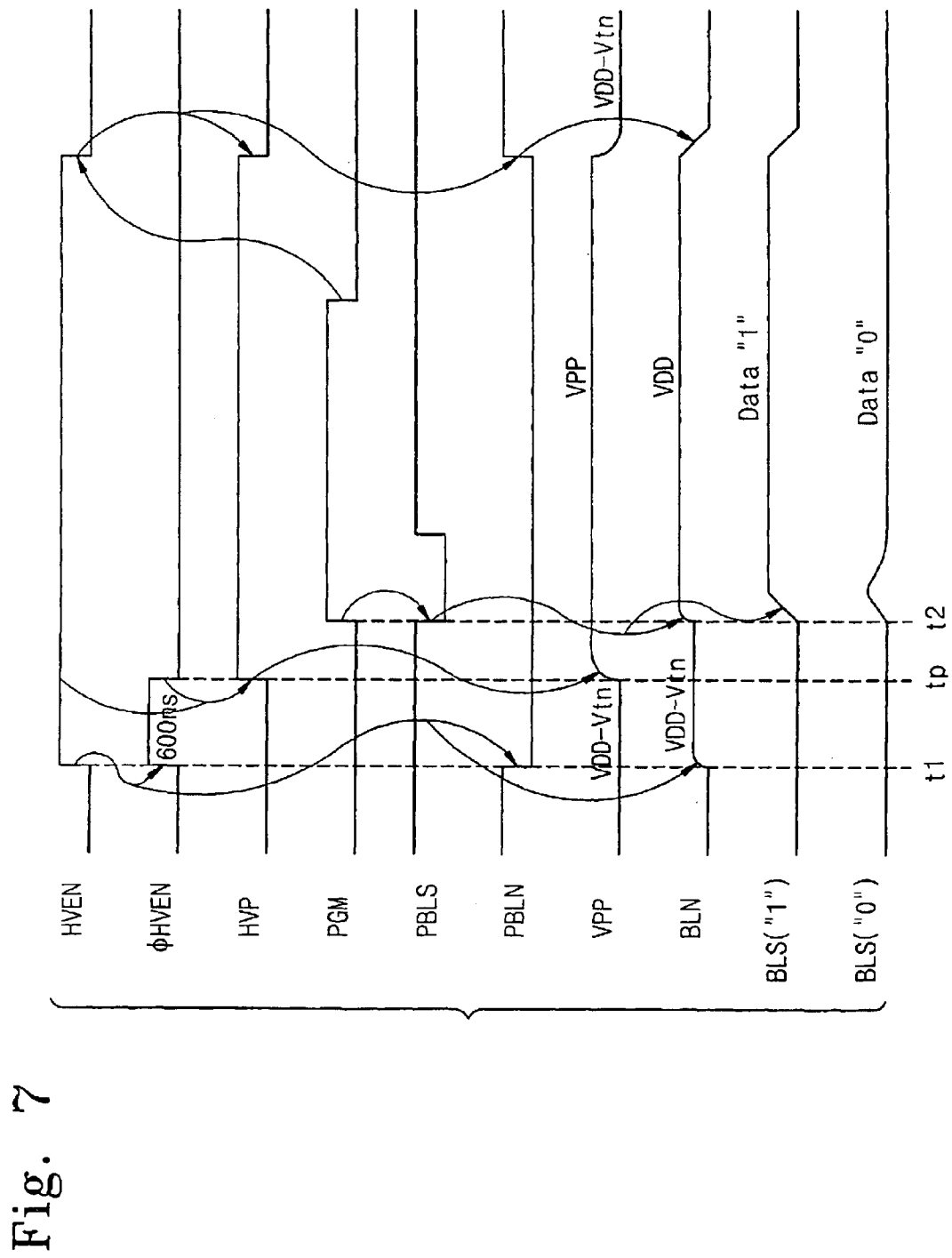
FIG. 7 is a timing diagram of a program operation in a flash memory according to an embodiment of the present invention.

The charging operation of the bit lines and the program operation will be described with reference to FIG. 7. At an early state, all the bit lines maintain the ground voltage. Then, as the high voltage signal HVEN is activated at the time t1, a high level pulse ΦHVEN that maintains an activated state for 600 ns is generated. While the pulse ΦHVEN is activated at the high level, the high voltage control signal HVP is inactivated at a low level. On the other hand, the lead precharge signal PBLN is activated to a low level in response to the activation of the high voltage signal HVEN. At this time, the erase signal ER is at a low level during the program operation.

The lead precharge signal PBLN of low level is applied to the lead precharge circuit 20 of FIG. 3 to thereby turn on the PMOS transistor MP21. According, the power supply voltage VDD is connected to the non-selected bit lines through data lines and column gates corresponding to the non-selected bit lines BLN. Since the power supply voltage VDD passes the NMOS transistors used as the column gates, the non-selected bit lines BLN are first precharged to [VDD−Vtn] (where Vtn is a threshold voltage of a column gate NMOS transistor). At this time, the selected bit line BLS maintains the ground voltage.

Then, if the high level pulse duration of ΦHVEN is terminated at the time tp, a high voltage control signal HVP outputted from the circuit of FIG. 4 is activated to a high level and the bit lines are charged to the high voltage VPP for program operation. The high voltage VPP may be applied to the source line SL of FIG. 3, for example, which is in signal communication with the bit lines BL1 though Blk.

If the program signal is activated to the high level at the time t2 while the non-selected bit lines remain at a voltage level [VDD−Vtn] and the high voltage VPP is increasing up to 10 V, the main precharge signal PBLS is activated to a low level. Then, as shown in FIG. 5, any one of the first precharge signal PBLS1 for precharging the bit lines contained in the left memory cell array MCA1 and the second precharge signal PBLSr for precharging the bit lines contained in the right memory cell array MCAr is activated to a low level according to the logic state of an address bit XA8 used to select a memory cell array. As the PMOS transistors MP1 to MPk for precharging bit lines are turned on, all the bit lines BL1 through BLk are charged up to the power supply voltage VDD. Here, the voltage level of the selected bit line BLS goes from the ground voltage level to the power supply voltage level, and the voltage level of the non-selected bit lines goes from the voltage level of [VDD−Vtn] to the power supply voltage level.

As described above, if the precharge operation to the bit lines is completed, the selected bit line BLS is set to "1" or "0" according to a data value stored in a write buffer. If the program operation to the selected memory cell is completed, the program signal PGM is inactivated to a low level, and the high voltage signal HVEN is inactivated to a low level in response to the inactivation of the program signal PGM. Accordingly, the lead precharge signal PBLN is inactivated to a high level and the bit lines are reset to the ground voltage level.

According to exemplary embodiments of the present invention, the non-selected bit lines are first charged to a predetermined voltage level [VDD−Vtn] (at t1). Then, the high voltage required for the program operation is generated (at tp). After a predetermined interval elapses, the selected bit line is precharged together with the previously charged non-selected bit lines (at t2). Since the precharging timing of the bit line is different from the generating timing of the high voltage, it is possible to prevent the peak current from occurring due to the simultaneous voltage charging. In addition, since the memory cell array is divided into two or more portions and the bit line is precharged, the peak current can be further decentralized. It will be apparent to those of ordinary skill in the pertinent art that various modifications and variations can be made in alternate embodiments of the present invention based on the means and the manner shown in the embodiments described herein. Thus, it is intended that the present invention cover modifications and variations provided that they come within the scope or spirit of the appended claims or their equivalents.

What is claimed is:

1. A flash memory comprising:
    a memory cell array having pages, each of the pages including memory cells, bit lines and source lines;
    a first circuit in signal communication with the bit lines for charging non-selected bit lines among the bit lines to a first voltage level at a first time;
    a second circuit in signal communication with the bit lines for generating a pumping voltage higher than a power supply voltage at a second time; and
    a third circuit in signal communication with the bit lines for charging the bit lines to a second voltage level at a third time.

2. The flash memory of claim 1, wherein the first voltage level is lower than the second voltage level.

3. The flash memory of claim 2, wherein the second voltage level is the power supply voltage.

4. The flash memory of claim 1, wherein the second time is later than the first time by a predetermined interval.

5. The flash memory of claim 1, wherein the third time is later than the second time by a predetermined interval.

6. The flash memory of claim 1, wherein the first circuit is responsive to a high voltage signal and address information associated with the non-selected bit lines, the high voltage signal being activated to generate the pumping voltage.

7. The flash memory of claim 1, wherein the first circuit is inactivated while an erase control signal is in an activated state.

8. The flash memory of claim 1, wherein the second circuit is inactivated while a predetermined pulse signal is in an activated state.

9. The flash memory of claim 8, wherein the pulse signal exists between the first time and the second time.

10. The flash memory of claim 1, wherein the third circuit charges the bit lines to the second voltage in response to a program start signal at the third time.

11. A flash memory comprising:
    memory cell arrays having pages, each of the pages including memory cells, bit lines and source lines, the memory cell arrays being selectively driven according to address information;
    a first circuit in signal communication with the bit lines for charging non-selected bit lines of the bit lines to a first voltage level at a first time;
    a second circuit in signal communication with the bit lines for generating a pumping voltage higher than a power supply voltage at a second time; and
    a third circuit in signal communication with the bit lines for charging the bit lines to a second voltage level at a third time, the bit lines being contained in selected memory cell array among the memory cell arrays.

12. The flash memory of claim 11, wherein the first voltage level is lower than the second voltage level.

13. The flash memory of claim 12, wherein the second voltage level is the power supply voltage.

14. The flash memory of claim 11, wherein the second time is later than the first time by a predetermined interval.

15. The flash memory of claim 11, wherein the third time is later than the second time by a predetermined interval.

16. The flash memory of claim 11, wherein the first circuit is responsive to a high voltage signal and the address information, the high voltage signal being activated to generate the pumping voltage.

17. The flash memory of claim 11, wherein the first circuit is inactivated while an erase control signal is in an activated state.

18. The flash memory of claim 11, wherein the second circuit is inactivated while a predetermined pulse signal is in an activated state.

19. The flash memory of claim 18, wherein the pulse signal exists between the first time and the second time.

20. The flash memory of claim 11, wherein the third circuit charges the bit lines to the second voltage in response to a program start signal at the third time, the bit lines being contained in the memory cell array selected according to the address information.

21. A flash memory comprising:
    a first memory cell array for being selected when a predetermined address bit is in a first logic state;
    first precharge transistors in signal communication with the first memory cell array for connecting bit lines of the first memory cell array to a power supply in response to a first precharge signal;
    a second memory cell array disposed relative to the first memory cell array for being selected when the address bit is in a second logic state;
    second precharge transistors in signal communication with the second memory cell array for connecting bit lines of the second memory cell array to the power supply in response to a second precharge signal;
    a first circuit in signal communication with the bit lines of the first and second memory cell arrays for charging non-selected bit lines of the bit lines to a first voltage level at a first time;
    a second circuit in signal communication with the bit lines of the first and second memory cell arrays for generating a pumping voltage higher than the power supply voltage at a second time; and
    a third circuit in signal communication with the bit lines of the first and second memory cell arrays for charging the bit lines to a second voltage level at a third time, the bit lines being containing in a memory cell array selected according to the logic states of the address bit.

22. The flash memory of claim 21, wherein the first voltage level is lower than the second voltage level.

23. The flash memory of claim 22, wherein the second voltage level is the power supply voltage.

24. The flash memory of claim 21, wherein the second time is later than the first time by a predetermined interval.

25. The flash memory of claim 21, wherein the third time is later than the second time by a predetermined interval.

26. The flash memory of claim 21, wherein the first circuit is responsive to a high voltage signal and the address bit, the high voltage signal being activated to generate the pumping voltage.

27. The flash memory of claim 21, wherein the first circuit is inactivated while an erase control signal is in an activated state.

28. The flash memory of claim 21, wherein the second circuit is inactivated while a predetermined pulse signal is in an activated state.

29. The flash memory of claim 28, wherein the pulse signal exists between the first time and the second time.

30. The flash memory of claim 21, wherein the third circuit is activated by at least one precharge signal for a grouped memory cell array according to the logic state of the address bit, the at least one precharge signal being responsive to a program start signal at the third time.

* * * * *